(12) United States Patent
Akahane (10) Patent No.: US 12,328,124 B2
(45) Date of Patent: Jun. 10, 2025

(54) DELAY APPARATUS AND DELAY METHOD

(71) Applicant: FUJI ELECTRIC CO., LTD., Kanagawa (JP)

(72) Inventor: Masashi Akahane, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 91 days.

(21) Appl. No.: 18/470,385

(22) Filed: Sep. 19, 2023

(65) Prior Publication Data

US 2024/0162897 A1    May 16, 2024

(30) Foreign Application Priority Data

Nov. 10, 2022    (JP) .................................. 2022-180256

(51) Int. Cl.
     *H03K 5/135*      (2006.01)
     *H03K 5/00*      (2006.01)

(52) U.S. Cl.
CPC ... *H03K 5/135* (2013.01); *H03K 2005/00019* (2013.01)

(58) Field of Classification Search
CPC ......... H03K 5/135; H03K 2005/00013; H03K 2005/00019
USPC ................................................. 327/161, 182
See application file for complete search history.

(56) References Cited

U.S. PATENT DOCUMENTS

| 5,581,207 | A | * | 12/1996 | Bazes | .................... | H03K 5/133 |
| | | | | | | 327/261 |
| 6,075,395 | A | * | 6/2000 | Saeki | ..................... | H03K 5/133 |
| | | | | | | 327/277 |
| 2001/0020859 | A1 | * | 9/2001 | Saeki | ..................... | H03K 5/133 |
| | | | | | | 327/160 |
| 2004/0153602 | A1 | * | 8/2004 | Lovett | ................... | G11C 11/406 |
| | | | | | | 711/167 |
| 2008/0164929 | A1 | * | 7/2008 | Kessels | ..................... | H03K 5/13 |
| | | | | | | 327/261 |

FOREIGN PATENT DOCUMENTS

| JP | 2008166981 A | 7/2008 |
| JP | 2013243436 A | 12/2013 |

* cited by examiner

*Primary Examiner* — William Hernandez (57) ABSTRACT

Provided is a delay apparatus which outputs a delayed signal obtained by delaying an asynchronous input signal, the delay apparatus comprising: a synchronous delay unit which determines, in response to detection of a change in the asynchronous input signal at a detection timing synchronous with a clock signal, a synchronous delay timing later than the detection timing by a reference delay time according to the clock signal; and an asynchronous delay unit which changes the delayed signal at an asynchronous delay timing obtained by delaying the synchronous delay timing by an adjustment time obtained by subtracting a detection delay time from a change timing of the asynchronous input signal to the detection timing from a set time according to the clock signal.

11 Claims, 5 Drawing Sheets

DELAY APPARATUS AND DELAY METHOD

The contents of the following patent application(s) are incorporated herein by reference:
NO. 2022-180256 filed in JP on Nov. 10, 2022

BACKGROUND

1. Technical Field

The present invention relates to a delay apparatus and a delay method.

2. Related Art

When delaying an asynchronous input signal, a capacitor or a multistage logic circuit has been hitherto used to clock a delay time from a change timing of the input signal to a change in an output signal is changed (see Patent Document 1, for example).
Patent Document 1: Japanese Patent Application Publication No. 2013-243436
Patent Document 2: Japanese Patent Application Publication No. 2008-166981

DESCRIPTION OF EXEMPLARY EMBODIMENTS

Hereinafter, embodiments of the present invention will be described, but the embodiments do not limit the invention according to the claims. In addition, not all combinations of features described in the embodiments are essential to the solution of the invention.

Figure 1:
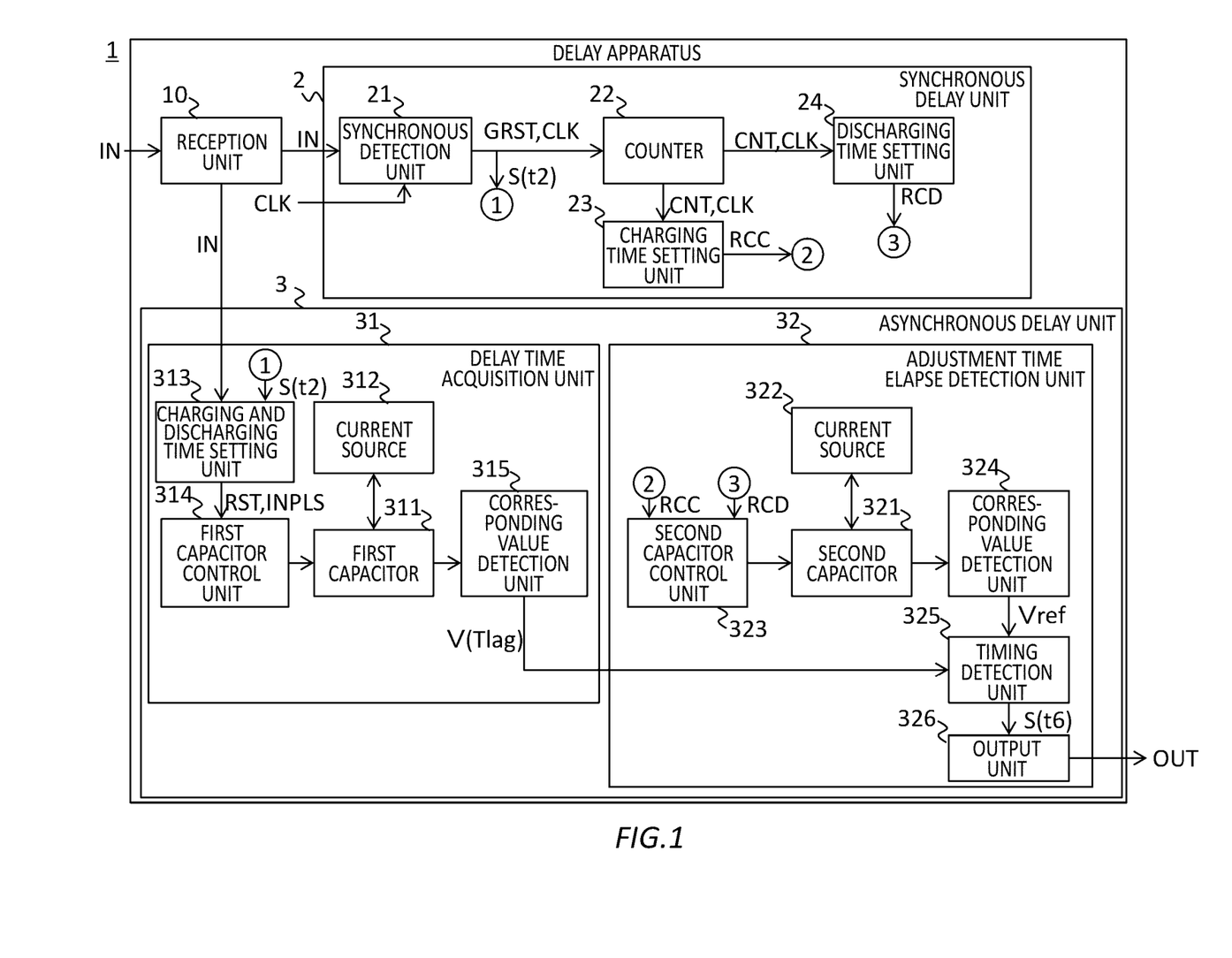
FIG. 1 shows a delay apparatus 1 according to an embodiment.

1. Embodiment (1.1 Delay Apparatus 1)
FIG. 1 shows a delay apparatus 1 according to the present embodiment. The delay apparatus 1 outputs a delayed signal OUT obtained by delaying an asynchronous input signal IN to be input. The asynchronous input signal IN may be input from an external apparatus (not shown) asynchronous with the delay apparatus 1. For example, the delay apparatus 1 may be built into an IPM (intelligent power module), and the asynchronous input signal IN may be a control signal supplied from a control apparatus of the IPM. The asynchronous input signal IN may be a pulse signal, and may have a pulse width of 1 μs to 10 ms, as an example. The delay apparatus 1 includes a reception unit 10, a synchronous delay unit 2, and an asynchronous delay unit 3.
(1.1.1. Reception Unit 10)
The reception unit 10 receives the asynchronous input signal IN from the external apparatus. The reception unit 10 may supply the received asynchronous input signal IN to the synchronous delay unit 2 and the asynchronous delay unit 3.

(1.1.2. Synchronous Delay Unit 2)
In response to detection of a change in the asynchronous input signal IN at a detection timing t2 synchronous with a clock signal CLK, the synchronous delay unit 2 determines a synchronous delay timing t5 later than the detection timing t2 by a reference delay time TS according to the clock signal CLK. The synchronous delay unit 2 may include a synchronous detection unit 21, a counter 22, a charging time setting unit 23, and a discharging time setting unit 24.

Here, the change in the asynchronous input signal IN may be a rise or fall of the asynchronous input signal IN. The detection of the change in the asynchronous input signal IN at a timing synchronous with the clock signal CLK may be detection of the change in the asynchronous input signal IN at a timing later than a timing of that change among a plurality of timings synchronous with the clock signal CLK. The timing synchronous with the clock signal CLK may be a rise timing or fall timing of the clock signal CLK. The clock signal CLK may have a frequency of 2 MHz, for example, or may have a higher frequency obtained by dividing 2 MHz. The clock signal CLK may be output from an oscillator (not shown) internal or external to the delay apparatus 1. A time according to the clock signal CLK may be a time defined by the timing synchronous with the clock signal CLK, may be a time equivalent to integral multiple times of the clock cycle, or may be a time obtained by adding a half of the clock cycle to the time equivalent to integral multiple times of the clock cycle. The reference delay time TS may have a preset length, and as an example in the present embodiment, may have a length equivalent to 14.5 cycles of the clock signal CLK.

(1.1.2-1. Synchronous Detection Unit 21)
The synchronous detection unit 21 detects the change in the asynchronous input signal IN at the timing synchronous with the clock signal CLK. The synchronous detection unit 21 may receive the asynchronous input signal IN from the reception unit 10 and receive the clock signal CLK from the oscillator described above, and may detect the rise and fall of the asynchronous input signal IN respectively at timings synchronous with the clock signal CLK.

For example, the synchronous detection unit 21 may detect a signal level of the asynchronous input signal IN at each timing synchronous with the clock signal CLK, and detect the change in the asynchronous input signal IN based on a difference between the signal level of the asynchronous input signal IN detected at a new timing and the signal level of the asynchronous input signal IN detected at an immediately previous timing. The synchronous detection unit 21 may include one or more D flip flops (not shown) which fetch the asynchronous input signal IN in response to the clock signal CLK and an XOR gate (not shown) which takes an exclusive OR of the signal levels of the asynchronous input signals IN fetched into the D flip flops at two timings.

The synchronous detection unit 21 may supply the asynchronous delay unit 3 with a signal S (t2), the signal level of which is switched at the detection timing t2 at which the change in the asynchronous input signal IN has been detected. In addition, the synchronous detection unit 21 may supply the counter 22 with a reset signal GRST having a pulse width equivalent to the half cycle of the clock signal CLK from the detection timing t2 and the clock signal CLK supplied from the oscillator.

(1.1.2-2. Counter 22)
The counter 22 counts the number of changes in the clock signal CLK. The counter 22 may count at least one of the number of rises or falls of the clock signal CLK, and as an example in the present embodiment, may count the number of falls.

The counter 22 may be reset in response to reception of the reset signal GRST from the synchronous detection unit 21 and start counting in response to an end of the reset signal GRST. The counter 22 may be a 4-bit counter, and may count up from 0 to 15 in decimal, in other words, from 0 to F in hexadecimal. The counter 22 may supply a count value CNT and the clock signal CLK to the charging time setting unit 23 and the discharging time setting unit 24.

(1.1.2-3. Charging Time Setting Unit 23)

The charging time setting unit 23 sets a charging time of a second capacitor 321 to be described below in the asynchronous delay unit 3. The charging time setting unit 23 may set, as the charging time, a period spanning a set time Tset according to the clock signal CLK from a timing at which the counter 22 has started counting, and may supply a second capacitor control unit 323 to be described below in the asynchronous delay unit 3 with a charging instruction signal RCC which continues over the charging time. Note that the set time Tset may have a preset length, and as an example in the present embodiment, may have a length equivalent to 1.5 cycles. The set time Tset may have a length obtained by subtracting the reference delay time TS from a desired delay time Td by which the asynchronous input signal IN is delayed. In other words, the set time Tset may be set to satisfy a formula: Delay time Td=Reference delay time TS+Set time Tset.

(1.1.2-4. Discharging Time Setting Unit 24)

The discharging time setting unit 24 sets a discharging time of the second capacitor 321 in the asynchronous delay unit 3. The discharging time setting unit 24 may be an example of a reference delay time elapse detection unit, and detects, as the synchronous delay timing t5, a timing at which the reference delay time TS has elapsed since the detection timing t2 based on the count value CNT obtained by the counter 22. The discharging time setting unit 24 may detect that a time elapsed since the detection timing t2 has reached the reference delay time TS based on the count value CNT. As an example in the present embodiment, since the reference delay time TS has a length equivalent to 14.5 clock cycles, the discharging time setting unit 24 may detect that the time elapsed since the detection timing t2 has reached the reference delay time TS based on the count value CNT and the clock signal CLK. The discharging time setting unit 24 may set, as the discharging time, a period spanning the set time Tset described above from the detected synchronous delay timing t5, and may supply the second capacitor control unit 323 in the asynchronous delay unit 3 with a discharging instruction signal RCD which continues over the discharging time.

(1.1.3. Asynchronous Delay Unit 3)

The asynchronous delay unit 3 changes the delayed signal OUT at an asynchronous delay timing t6 obtained by delaying the synchronous delay timing t5 by an adjustment time Tdiff obtained by subtracting a detection delay time Tlag from the set time Tset. The detection delay time Tlag may be a time from a change timing t1 of the asynchronous input signal IN to the detection timing t2, and may be shorter than the set time Tset. The asynchronous delay unit 3 may include a delay time acquisition unit 31 and an adjustment time elapse detection unit 32.

(1.1.3-1. Delay Time Acquisition Unit 31)

The delay time acquisition unit 31 acquires a delay time corresponding value V (Tlag) according to the detection delay time Tlag. As an example in the present embodiment, the delay time corresponding value V (Tlag) may be a value indicating voltage. The delay time acquisition unit 31 may include a first capacitor 311, a current source 312, a charging and discharging time setting unit 313, a first capacitor control unit 314, and a corresponding value detection unit 315.

(1.1.3-1-1. First Capacitor 311)

The first capacitor 311 is charged with a constant current. As an example in the present embodiment, the first capacitor 311 may have a capacitance $C_1$ and be charged with a constant current $I_1$.

(1.1.3-1-2. Current Source 312)

The current source 312 supplies the constant current $I_1$ to the first capacitor 311.

(1.1.3-1-3. Charging and Discharging Time Setting Unit 313)

The charging and discharging time setting unit 313 sets a charging and discharging time of the first capacitor 311. The charging and discharging time setting unit 313 may receive the asynchronous input signal IN from the reception unit 10 and receive the signal S (t2) from the synchronous detection unit 21, and may set, as the charging time, a period spanning the detection delay time Tlag from the change timing t1 of the asynchronous input signal IN to the detection timing t2. The charging and discharging time setting unit 313 may supply the first capacitor control unit 314 with a charging instruction signal INPLS which continues over the charging time. The charging and discharging time setting unit 313 may have an XOR gate (not shown) which takes an exclusive OR of the asynchronous input signal IN supplied from the reception unit 10 and the signal S (t2) supplied from the synchronous detection unit 21. The charging and discharging time setting unit 313 may supply the first capacitor control unit 314 with a reset instruction signal RST for causing the first capacitor 311 to be reset before the charging instruction signal INPLS is supplied. Causing the first capacitor 311 to be reset may be causing the first capacitor 311 to be discharged to a reference amount of charge (0, as an example).

(1.1.3-1-4. First Capacitor Control Unit 314)

The first capacitor control unit 314 controls charging of the first capacitor 311. The first capacitor control unit 314 may cause the first capacitor 311 to be charged by causing the first capacitor 311 to be electrically connected to the current source 312. The first capacitor control unit 314 may cause the first capacitor 311 to be charged in response to the charging instruction signal INPLS supplied from the charging and discharging time setting unit 313. The first capacitor control unit 314 may cause the first capacitor 311 to be reset in response to a reset signal RST supplied from the charging and discharging time setting unit 313.

(1.1.3-1-5. Corresponding Value Detection Unit 315)

The corresponding value detection unit 315 detects, as the delay time corresponding value V (Tlag), a value according to an amount of charge charged to the first capacitor 311 over the detection delay time Tlag. As an example in the present embodiment, the corresponding value detection unit 315 may detect, as the delay time corresponding value V (Tlag), a value obtained by subtracting the reference amount of charge (0, as an example in the present embodiment) from the amount of charge of the first capacitor 311 after the detection delay time Tlag has elapsed. The corresponding value detection unit 315 may supply the detected delay time corresponding value V (Tlag) to the adjustment time elapse detection unit 32.

(1.1-3-2. Adjustment Time Elapse Detection Unit 32)

The adjustment time elapse detection unit 32 detects the asynchronous delay timing t6 later than the synchronous delay timing t5 by the adjustment time Tdiff based on the delay time corresponding value V (Tlag). The adjustment time elapse detection unit 32 may include a second capacitor 321, a current source 322, a second capacitor control unit 323, a corresponding value detection unit 324, a timing detection unit 325, and an output unit 326.

(1.1.3-2-1. Second Capacitor 321)

The second capacitor 321 is discharged with a constant current. The second capacitor 321 may be charged and discharged with the constant current having the same current value by the second capacitor control unit 323. As an example in the present embodiment, the second capacitor 321 may have a capacitance $C_2$ and be charged and discharged with a constant current $I_2$. There may be a relationship of $I_2=I_1 \times C_2/C_1$ between the capacitance $C_2$ of the second capacitor 321 and the constant current $I_2$ for charging and discharging, and the capacitance $C_1$ of the first capacitor 311 described above and the constant current $I_1$ for charging. Accordingly, a charging and discharging speed of the second capacitor 321 may be the same as a charging speed of the first capacitor 311.

(1.1.3-2-2. Current Source 322)

The current source 322 supplies positive and negative constant currents $I_2$ to the second capacitor 321. The current source 322 may supply the positive constant current $I_2$ to the second capacitor 321 as a source type current source, and may supply the negative constant current $I_2$ to the second capacitor 321 as a sink type current source. If the capacitance $C_1$ of the first capacitor 311 and the capacitance $C_2$ of the second capacitor 321 are equal, the current source 322 may be the same as the current source 322 of the delay time acquisition unit 31.

(1.1.3-2-3. Second Capacitor Control Unit 323)

The second capacitor control unit 323 controls charging and discharging of the second capacitor 321. The second capacitor control unit 323 may cause the second capacitor 321 to be charged to an amount of charge corresponding to a set time, and then cause discharging of the second capacitor 321 to be started from the synchronous delay timing t5. As an example in the present embodiment, the second capacitor control unit 323 may charge the second capacitor 321 over the set time Tset, and then discharge the second capacitor 321 over at least the set time from the synchronous delay timing t5. The second capacitor control unit 323 may cause the second capacitor 321 to be charged in response to the charging instruction signal RCC supplied from the charging time setting unit 23. The second capacitor control unit 323 may cause the second capacitor 321 to be discharged in response to the discharging instruction signal RCD supplied from the discharging time setting unit 24.

Note that, if the discharging time exceeds the set time Tset, a remaining amount of charge of the second capacitor 321 may become zero at a timing when the set time Tset has elapsed. The second capacitor control unit 323 may cause the second capacitor 321 to be charged and discharged by causing the second capacitor 321 to be electrically connected to the current source 322 of a source type or a sink type.

(1.1.3-2-4. Corresponding Value Detection Unit 324)

The corresponding value detection unit 324 detects a value (also referred to as a reference value Vref) according to an amount of charge of the second capacitor 321. As an example in the present embodiment, the corresponding value detection unit 324 may detect, as the reference value Vref, the remaining amount of charge of the second capacitor 321 over a discharging period of the second capacitor 321. The corresponding value detection unit 324 may supply the detected reference value Vref to the timing detection unit 325.

(1.1.3-2-5. Timing Detection Unit 325)

The timing detection unit 325 detects, as the asynchronous delay timing t6, a timing at which a value according to the remaining amount of charge of the second capacitor 321 has decreased to the delay time corresponding value V (Tlag). The timing detection unit 325 may receive the reference value Vref from the corresponding value detection unit 324 of the adjustment time elapse detection unit 32 and acquire the delay time corresponding value V (Tlag) from the corresponding value detection unit 315 of the delay time acquisition unit 31, and detect a timing at which the reference value Vref has decreased to become the delay time corresponding value V (Tlag). As an example, the timing detection unit 325 may include a comparator (not shown) which compares the reference value Vref with the delay time corresponding value V (Tlag).

Here, as an example in the present embodiment, a discharging speed of the second capacitor 321 is equal to the charging speed of the first capacitor 311. As such, a time taken for the remaining amount of charge of the second capacitor 321 to become zero after decreasing to the delay time corresponding value V (Tlag) is equal to a time over which the first capacitor 311 is charged to the delay time corresponding value V (Tlag) after being reset, that is, the detection delay time Tlag. Therefore, a timing at which the remaining amount of charge of the second capacitor 321 decreases to the delay time corresponding value V (Tlag) may indicate a timing preceding an end timing of the set time Tset by the detection delay time Tlag. In other words, the timing at which the remaining amount of charge of the second capacitor 321 decreases to the delay time corresponding value V (Tlag) may indicate the asynchronous delay timing t6 delayed from a start timing of the set time Tset, that is, the synchronous delay timing t5 by the adjustment time Tdiff obtained by subtracting the detection delay time Tlag from the set time Tset.

The timing detection unit 325 may supply the output unit 326 with a signal S (t6), the signal level of which is switched at the asynchronous delay timing t6.

(1.1.3-2-6. Output Unit 326)

The output unit 326 outputs the delayed signal OUT obtained by delaying the asynchronous input signal IN. The output unit 326 may change a signal level of the delayed signal OUT at the asynchronous delay timing t6 in response to the signal S (t6) supplied from the timing detection unit 325.

According to the delay apparatus 1 described above, in response to detection of the change in the asynchronous input signal IN at the detection timing t2 synchronous with the clock signal CLK, the synchronous delay timing t5 later than the detection timing t2 by the reference delay time TS according to the clock signal CLK is determined. Then, the delayed signal OUT changes at the asynchronous delay timing t6 obtained by delaying the synchronous delay timing t5 by the adjustment time Tdiff obtained by subtracting the detection delay time Tlag from the change timing of the asynchronous input signal IN to the detection timing t2 from the set time Tset according to the clock signal CLK. Therefore, regardless of a frequency of the clock signal CLK, it is possible to accurately reproduce an amount of gap between the detection timing t2 synchronous with the clock signal CLK and the change timing of the asynchronous input signal IN, that is, the detection delay time Tlag and to generate the delayed signal OUT obtained by causing a delay by the desired delay time Td. In addition, since the asynchronous delay timing t6 obtained by delaying the synchronous delay timing t5 by the adjustment time Tdiff asynchronous with the clock signal CLK is determined in addition to that the synchronous delay timing t5 later than the detection timing t2 by the reference delay time TS according to the clock signal CLK is determined, it is possible to separately perform detection of a timing at which the reference delay time TS has elapsed and detection of a timing at which the adjustment time Tdiff has elapsed. Therefore, unlike a case where a time taken from the change timing of the asynchronous input signal IN to reach the desired delay time Td is clocked by a capacitor or a multistage logic circuit, it is possible to prevent an increase in size of the delay apparatus 1 resulting from the delay time Td being lengthened.

In addition, the change in the asynchronous input signal IN is detected by the synchronous delay unit 2 at the timing synchronous with the clock signal CLK, and the timing at which the reference delay time TS has elapsed since the detection timing t2 is detected as the synchronous delay timing t5 based on a count value of the number of changes in the clock signal CLK. Therefore, it is possible to accurately detect the synchronous delay timing t5 later than the detection timing t2 by the reference delay time TS. In addition, since the synchronous delay timing t5 is detected with the counter 22 unlike a case where the synchronous delay timing t5 is detected with the capacitor or the multistage logic circuit, it is possible to reliably prevent the increase in size of the delay apparatus 1 resulting from the delay time Td being lengthened.

In addition, the delay time corresponding value V (Tlag) according to the detection delay time Tlag is acquired by the asynchronous delay unit 3, and the asynchronous delay timing t6 later than the synchronous delay timing t5 by the adjustment time Tdiff is detected based on the delay time corresponding value V (Tlag). Therefore, the asynchronous delay timing t6 can be accurately detected. As such, it is possible to accurately reproduce the detection delay time Tlag and to generate the delayed signal OUT obtained by accurately delaying the asynchronous input signal IN by the desired delay time Td.

In addition, since the value according to the amount of charge charged to the first capacitor 311 over the detection delay time Tlag is detected as the delay time corresponding value V (Tlag), the delay time corresponding value V (Tlag) according to the detection delay time Tlag can be easily acquired with a simple configuration.

In addition, the second capacitor 321 is discharged from the synchronous delay timing t5 after being charged to an amount of charge corresponding to the set time Tset, and the timing at which the value according to the remaining amount of charge of the second capacitor 321 has decreased to the delay time corresponding value V (Tlag) is detected as the asynchronous delay timing t6. Therefore, it is possible to detect the asynchronous delay timing t6 without directly measuring the adjustment time Tdiff. As such, the asynchronous delay timing t6 can be easily detected with a simple configuration.

In addition, the second capacitor 321 is charged and discharged with the constant current $I_2$ having the same current value, and is discharged over at least the set time Tset from the synchronous delay timing t5 after being charged by the second capacitor control unit 323 over the set time Tset. Therefore, it is possible to accurately detect the asynchronous delay timing t6 later than the synchronous delay timing t5 by the adjustment time Tdiff.

(1.2. Operation)

Figure 2:
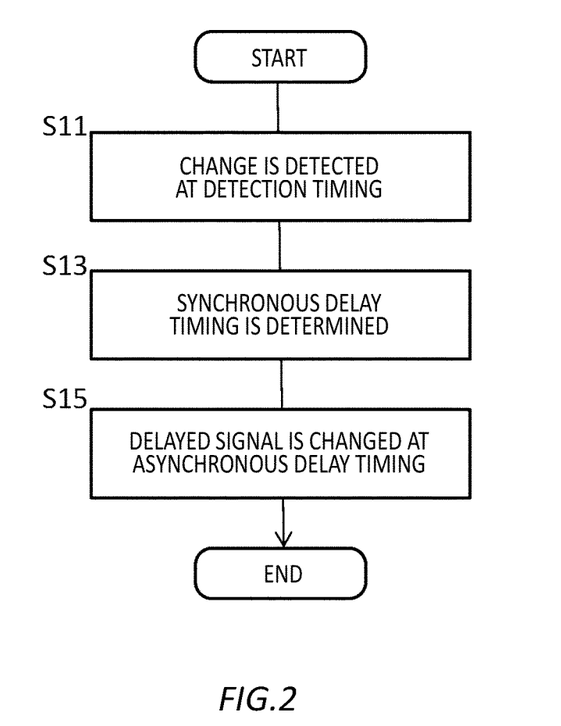
FIG. 2 shows operation of the delay apparatus 1.

FIG. 2 shows operation of the delay apparatus 1. The delay apparatus 1 outputs the delayed signal OUT obtained by delaying the asynchronous input signal IN by performing processing of steps S11 to S15. Note that the operation in FIG. 2 may be executed each time the asynchronous input signal IN changes.

In step S11, the synchronous detection unit 21 of the synchronous delay unit 2 detects a change in the asynchronous input signal IN at the detection timing t2 synchronous with the clock signal CLK. The synchronous detection unit 21 may detect a rise or fall of the asynchronous input signal IN.

In step S13, the discharging time setting unit 24 of the synchronous detection unit 21 determines the synchronous delay timing t5 later than the detection timing t2 by the reference delay time TS according to the clock signal CLK. As an example in the present embodiment, the discharging time setting unit 24 may set, as a discharging time, a period spanning the set time Tset from the detected synchronous delay timing t5.

In step S15, the asynchronous delay unit 3 changes the delayed signal OUT at the asynchronous delay timing t6 obtained by delaying the synchronous delay timing t5 by the adjustment time Tdiff obtained by subtracting the detection delay time Tlag from the change timing t1 of the asynchronous input signal IN to the detection timing t2 from the set time Tset. Accordingly, an amount of gap between the detection timing t2 synchronous with the clock signal CLK and the change timing of the asynchronous input signal IN, that is, the detection delay time Tlag is accurately reproduced, and the delayed signal OUT obtained by causing a delay by the desired delay time Td is generated.

(1.3. Operation Waveform)

Figure 3:
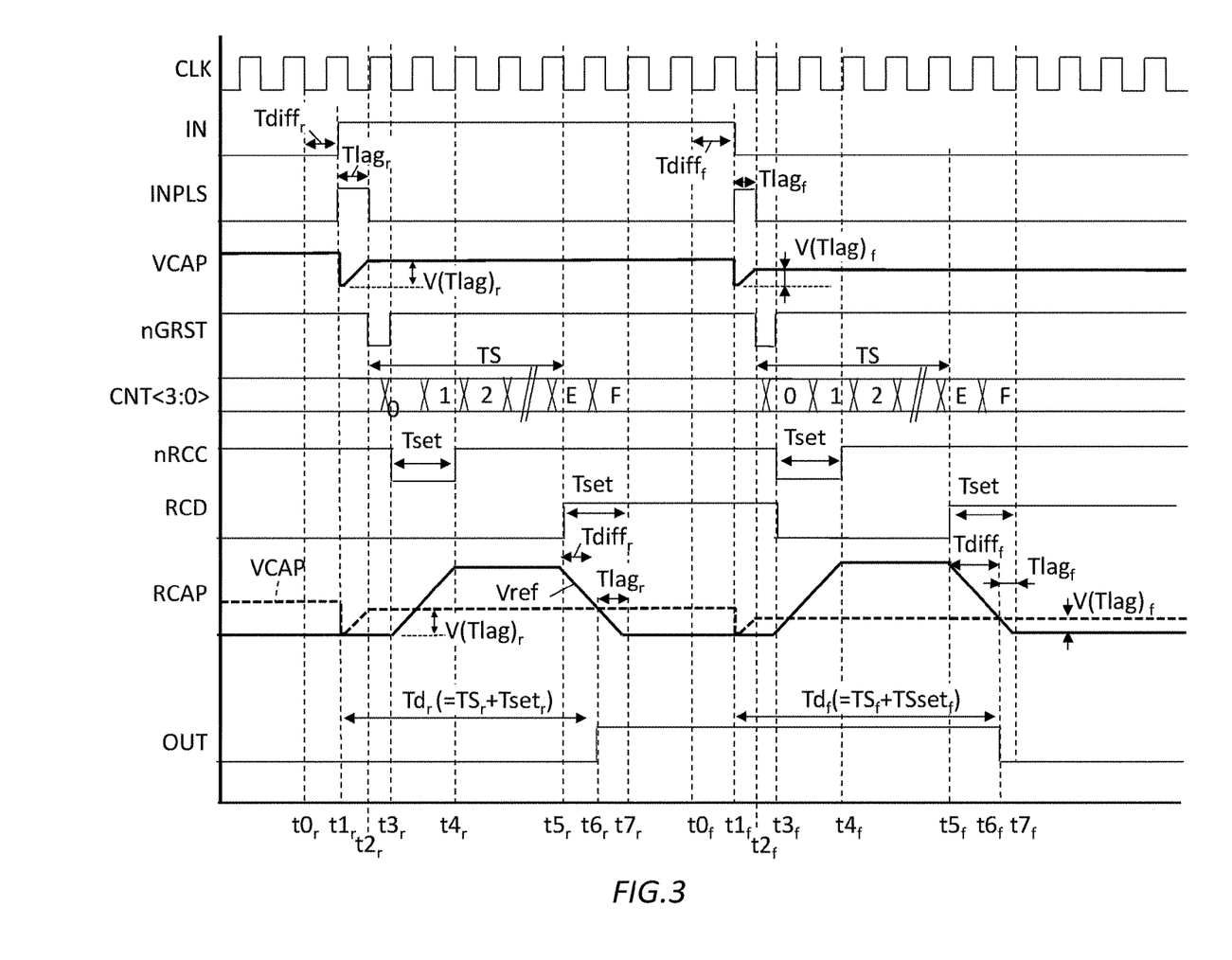
FIG. 3 shows operation waveforms of the delay apparatus 1.

FIG. 3 shows operation waveforms of the delay apparatus 1 together with a counter value CNT obtained by the counter 22. Note that, in this figure and FIG. 5 to be described below, the horizontal axis represents time, and the vertical axis represents respective voltage levels of the clock signal CLK, the asynchronous input signal IN, the charging instruction signal INPLS from the charging and discharging time setting unit 313, the reset signal RST, a charging voltage VCAP of the first capacitor 311, the charging instruction signal RCC from the charging time setting unit 23, the discharging instruction signal RCD from the discharging time setting unit 24, a charging voltage RCAP of the second capacitor 321, and the delayed signal OUT to be output. An index r attached to each sign in this figure, FIG. 4 to be described below, and the like indicates that a target such as a signal or timing indicated by the sign corresponds to a rise of the asynchronous input signal IN. Similarly, an index f indicates that the target indicated by the sign corresponds to a fall of the asynchronous input signal IN.

When the asynchronous input signal IN rises at a timing asynchronous with the clock signal CLK at a time point $t1_r$ (also referred to as a change timing $t1_r$), the charging and discharging time setting unit 313 outputs the reset signal RST (not shown) to the first capacitor control unit 314 to reset the first capacitor 311, and then the charging instruction signal INPLS is switched to a high level to start charging of the first capacitor 311.

At a time point $t2_r$ (also referred to as a detection timing $t2_r$), the synchronous detection unit 21 detects a change in the asynchronous input signal IN at a rise timing of the clock signal CLK. Accordingly, a signal level of the signal S (t2)

(not shown) from the synchronous detection unit 21 is switched, the charging and discharging time setting unit 313 switches the charging instruction signal INPLS to a low level, and the charging of the first capacitor 311 ends. As a result, the first capacitor 311 is charged over the detection delay time Tlag from the change timing $t1_r$ to the detection timing $t2_r$, and the charging voltage VCAP becomes a delay time corresponding value V (Tlag)$_r$.

In addition, the synchronous detection unit 21 outputs the reset signal GRST having a pulse width equivalent to a half cycle of the clock signal CLK from the detection timing $t2_r$, to cause a count value by the counter 22 to be reset. Note that, as an example in the present embodiment, the reset signal GRST may be a low-level pulse signal.

When the reset signal GRST ends at a time point $t3_r$, the counter 22 starts counting up. Accordingly, the charging time setting unit 23 outputs the charging instruction signal RCC which continues over the set time Tset from the time point $t3_r$ to a time point $t4_r$, and causes the second capacitor 321 to be charged.

When a time elapsed since the detection timing $t2_r$ reaches the reference delay time TS at a time point $t5_r$ (also referred to as a synchronous delay timing $t5_r$), the discharging time setting unit 24 outputs the discharging instruction signal RCD which continues over at least a set time Tset$_r$ from the time point $t5_r$ to a time point $t7_r$. Accordingly, the remaining amount of charge Vref of the second capacitor 321 decreases at a constant speed from the time point $t5_r$ to the time point $t7_r$. Note that, as an example in the present embodiment, the discharging time setting unit 24 may output the discharging instruction signal RCD which continues from the time point $t5_r$ to a time point $t1_f$ to be described below.

When the remaining amount of charge Vref decreases to the delay time corresponding value V (Tlag)$_r$ at a time point $t6_r$ (also referred to as an asynchronous delay timing $t6_r$), the delayed signal OUT rises. Accordingly, the delayed signal OUT rises at a timing delayed from the rise of the asynchronous input signal IN by the desired delay time Td (=TS+Tset).

When the asynchronous input signal IN falls at the timing asynchronous with the clock signal CLK at a time point $t1_f$ (also referred to as a change timing $t1_f$), the charging and discharging time setting unit 313 outputs the reset signal RST (not shown) to the first capacitor control unit 314 to reset the first capacitor 311, and then the charging instruction signal INPLS is switched to the high level to start the charging of the first capacitor 311.

At a time point $t2_f$ (also referred to as a detection timing $t2_f$), the synchronous detection unit 21 detects the change in the asynchronous input signal IN at the rise timing of the clock signal CLK. Accordingly, the signal level of the signal S (t2) (not shown) from the synchronous detection unit 21 is switched, the charging and discharging time setting unit 313 switches the charging instruction signal INPLS to the low level, and the charging of the first capacitor 311 ends. As a result, the first capacitor 311 is charged over the detection delay time Tlag from the change timing $t1_r$ to the detection timing $t2_f$, and the charging voltage VCAP becomes a delay time corresponding value V (Tlag)$_f$.

In addition, the synchronous detection unit 21 outputs the reset signal GRST having the pulse width equivalent to the half cycle of the clock signal CLK from the detection timing t2, to cause the count value by the counter 22 to be reset.

When the reset signal GRST ends at a time point $t3_f$, the counter 22 starts counting up. Accordingly, the charging time setting unit 23 outputs the charging instruction signal RCC which continues over the set time Tset from the time point $t3_f$ to a time point $t4_f$, and causes the second capacitor 321 to be charged.

When a time elapsed since the detection timing $t2_f$ reaches the reference delay time TS at a time point $t5_f$ (also referred to as a synchronous delay timing $t5_f$), the discharging time setting unit 24 outputs the discharging instruction signal RCD which continues over at least the set time Tset from the time point $t5_f$ to a time point $t7_f$. Accordingly, the remaining amount of charge Vref of the second capacitor 321 decreases at a constant speed from the time point $t5_f$ to the time point $t7_f$.

When the remaining amount of charge Vref decreases to the delay time corresponding value V (Tlag)$_f$ at a time point $t6_f$ (also referred to as an asynchronous delay timing $t6_f$), the delayed signal OUT falls. Accordingly, the delayed signal OUT falls at a timing delayed from the fall of the asynchronous input signal IN by the desired delay time Td (=TS+Tset).

2. Modified Example (2.1. Delay Apparatus 1A)

Figure 4:
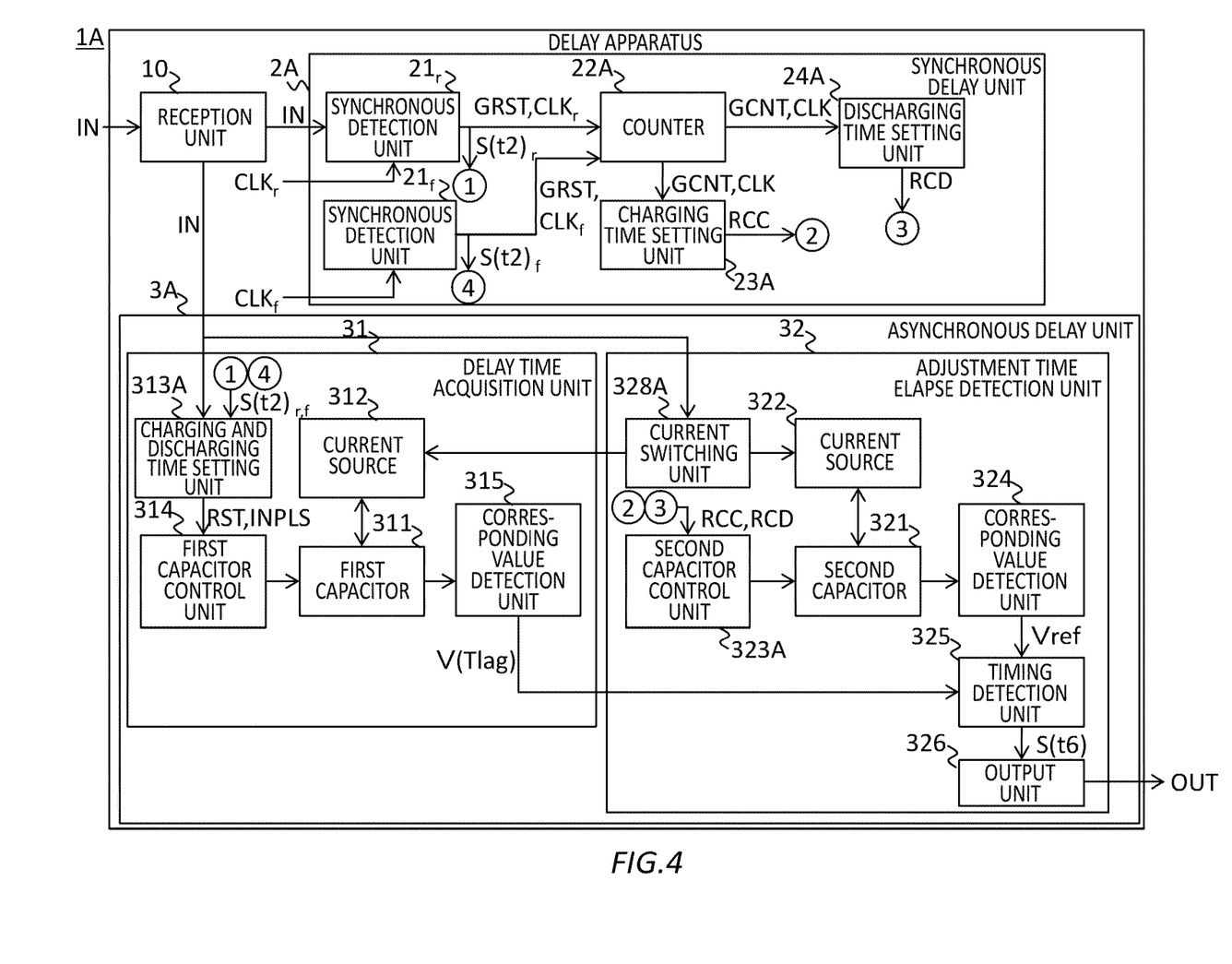
FIG. 4 shows a delay apparatus 1A according to a modified example.

FIG. 4 shows a delay apparatus 1A according to a modified example. Note that the same references are assigned to components substantially the same as those of the delay apparatus 1 shown in FIG. 1, and description thereof are omitted.

The delay apparatus 1A may be different from the delay apparatus 1 in that two clock signals $CLK_r$, $CLK_f$ are used and that a current value for charging and discharging the second capacitor 321 is switched depending on whether the asynchronous delayed signal IN rises or falls. The delay apparatus 1A may include a synchronous delay unit 2A and an asynchronous delay unit 3A.

Note that the clock signal $CLK_r$ may be an example of a first clock signal, and the clock signal $CLK_f$ may be an example of a second clock signal. The clock signals $CLK_r$, $CLK_f$ may have different frequencies, and as an example in the present embodiment, the clock signal $CLK_r$ may have a lower frequency than the clock signal $CLK_f$. The frequency of the clock signal $CLK_f$ may be an integral multiple of the frequency of the clock signal $CLK_r$, and the clock signal $CLK_f$ may be generated by dividing the clock signal $CLK_r$.

(2.1.1. Synchronous Delay Unit 2A)

The synchronous delay unit 2A may include synchronous detection units $21_r$, $21_f$, a counter 22A, a charging time setting unit 23A, and a discharging time setting unit 24A.

(2.1.1-1. Synchronous Detection Unit $21_r$)

The synchronous detection unit $21_r$ may be an example of a first synchronous detection unit, and detects a rise of the asynchronous input signal IN at a timing synchronous with the clock signal $CLK_r$. The synchronous detection unit $21_r$ may receive the asynchronous input signal IN from the reception unit 10 and receive the clock signal $CLK_r$ from an oscillator (not shown) internal or external to the delay apparatus 1A, and may detect the rise of the asynchronous input signal IN at the timing synchronous with the clock signal $CLK_r$, in the same manner as the synchronous delay unit 2 in the above-described embodiment.

The synchronous detection unit $21_r$ may supply the asynchronous delay unit 3A with a signal S $(t2)_r$, the signal level of which is switched at the detection timing $t2_r$ at which the change in the asynchronous input signal IN has been detected. In addition, the synchronous detection unit $21_r$ may supply the counter 22A with the reset signal GRST having a pulse width equivalent to a half cycle of the clock signal CLK$_r$ from the detection timing t2$_r$ and the clock signal CLK$_r$ supplied from the oscillator.

(2.1.1-2. Synchronous Detection Unit 21$_f$)

The synchronous detection unit 21$_f$ may be an example of a second synchronous detection unit, and detects a fall of the asynchronous input signal IN at a timing synchronous with the clock signal CLK$_f$. The synchronous detection unit 21$_f$ may receive the asynchronous input signal IN from the reception unit 10 and receive the clock signal CLK$_f$ from the oscillator (not shown) internal or external to the delay apparatus 1A, and may detect the fall of the asynchronous input signal IN at the timing synchronous with the clock signal CLK$_f$, in the same manner as the synchronous delay unit 2 in the above-described embodiment.

The synchronous detection unit 21$_f$ may supply the asynchronous delay unit 3A with a signal S (t2)$_f$, the signal level of which is switched at the detection timing t2$_f$ at which the change in the asynchronous input signal IN has been detected. In addition, the synchronous detection unit 21$_f$ may supply the counter 22A with the reset signal GRST having a pulse width equivalent to a half cycle of the clock signal CLK$_f$ from the detection timing t2$_f$ and the clock signal CLK$_f$ supplied from the oscillator.

(2.1.1-3. Counter 22A)

The counter 22A counts the number of changes in the clock signals CLK$_r$, CLK$_f$. The counter 22A may detect the number of changes in the clock signal CLK$_r$ from the detection timing t2$_r$ at which the rise of the asynchronous input signal IN has been detected by the synchronous detection unit 21$_r$, and detect the number of changes in the clock signal CLK$_f$ from the detection timing t2$_f$ at which the fall of the asynchronous input signal IN has been detected by the synchronous detection unit 21$_f$. The counter 22A may count the number of changes in the clock signal CLK$_r$ in response to being reset by receiving the reset signal GRST from the synchronous delay unit 2$_r$, and count the number of changes in the clock signal CLK$_f$ in response to being reset by receiving the reset signal GRST from the synchronous delay unit 2$_f$. The counter 22A may count at least one of the number of rises or falls of the clock signals CLK$_r$, CLK$_f$, and as an example in the present embodiment, may count the number of falls.

The counter 22A may be a 4-bit counter. The counter 22A may supply the charging time setting unit 23A and the discharging time setting unit 24A with the count value CNT and with the clock signal CLK (also referred to as a clock signal GCLK) out of the clock signal CLK$_r$ and the clock signal CLK$_f$, which has been used for counting (2.1.1-4. Charging Time Setting Unit 23A)

The charging time setting unit 23A sets a charging time of the second capacitor 321 in the asynchronous delay unit 3A, in the same manner as the charging time setting unit 23 in the above-described embodiment. The charging time setting unit 23A may set, as the charging time, a period spanning the set time Tset according to the clock signal GCLK from a timing at which the counter 22A has started counting. The charging time setting unit 23A may supply the second capacitor control unit 323A in the asynchronous delay unit 3A with the charging instruction signal RCC which continues over the charging time.

Note that, if the clock signal GCLK is the clock signal CLK$_r$, the set time Tset (also referred to as the set time Tset$_r$) may be defined at the timing synchronous with the clock signal CLK$_r$, and if the clock signal GCLK is the clock signal CLK$_f$, the set time Tset (also referred to as a set time Tset$_f$) may be defined at the timing synchronous with the clock signal CLK$_f$. The set time Tset$_r$ and the set time Tset$_f$ may have different lengths.

(2.1.1-5. Discharging Time Setting Unit 24A)

The discharging time setting unit 24A sets a discharging time of the second capacitor 321 in the asynchronous delay unit 3A, in the same manner as the discharging time setting unit 24A in the above-described embodiment.

The discharging time setting unit 24A may detect, as the synchronous delay timings t5$_r$, t5$_f$, timings at which the reference delay time TS has elapsed since the detection timings t2$_r$, t2$_f$ based on the count value CNT obtained by the counter 22A. Note that, if the clock signal GSLK is the clock signal CLK$_r$, the reference delay time TS (also referred to as a reference delay time TS$_r$) may be defined at the timing synchronous with the clock signal CLK$_r$, and if the clock signal GSLK is the clock signal CLK$_f$, the reference delay time TS (also referred to as a reference delay time TS$_f$) may be defined at the timing synchronous with the clock signal CLK$_f$. Therefore, in response to the rise of the asynchronous input signal IN, the discharging time setting unit 24A may detect the synchronous delay timing t5$_r$ later than that detection timing t2$_r$ by the reference delay time TS$_r$. In response to the fall of the asynchronous input signal IN, the discharging time setting unit 24A may detect the synchronous delay timing t5$_f$ later than that detection timing t2$_f$ by the reference delay time TS$_f$. The reference delay time TS$_r$ and the reference delay time TS$_f$ may have different lengths.

The discharging time setting unit 24A may detect the synchronous delay timing t5$_r$ based on a timing at which the count value CNT from the detection timing t2$_r$ has reached a reference count value, and detect the synchronous delay timing t5$_f$ based on a timing at which the count value from the detection timing t2$_f$ has reached the reference count value. Detecting the synchronous delay timings t5$_r$, t5$_f$ based on the timings at which the count values have reached the reference count value may be detecting those timings as the synchronous delay timings t5$_r$, t5$_f$, or may be detecting, as the synchronous delay timings t5$_r$, t5$_f$, timings later than the synchronous delay timings t5$_r$, t5$_f$ by a half cycle of the clock signal GCLK. As an example in this modified example, the discharging time setting unit 24A may detect, as the synchronous delay timings 5t$_r$, 5t$_f$, timings later than timings at which the count values from the detection timings 2t$_r$, 2t$_f$ have reached 14 in decimal, in other words, E in hexadecimal by the half cycle of the clock signal GCLK.

The discharging time setting unit 24A may set, as discharging times, periods spanning the set times Tset$_r$, Tset$_f$ according to the clock signal GCLK from the detected synchronous delay timings t5$_r$, t5$_f$. The discharging time setting unit 24A may supply the second capacitor control unit 323 in the asynchronous delay unit 3A with the discharging instruction signal RCD which continues over the discharging time.

(2.1.2. Asynchronous Delay Unit 3A)

The asynchronous delay unit 3A may include a charging and discharging time setting unit 313A, a second capacitor control unit 323A, and a current switching unit 328A.

(2.1.2-1. Charging and Discharging Time Setting Unit 313A)

The charging and discharging time setting unit 313A sets a charging time of the first capacitor 311. The charging and discharging time setting unit 313A may receive the asynchronous input signal IN from the reception unit 10 and receive the signals S (t2)$_r$, S (t2)$_f$ from the synchronous detection units 21$_r$, 21$_f$, and may set, as the charging time, a period spanning each of the detection delay time $Tlag_r$ from the change timing $t1_r$ of the asynchronous input signal IN to the detection timing $t2_r$, and the detection delay time $Tlag_f$ from the change timing $t1_f$ of the asynchronous input signal IN to the detection timing $t2_f$. The charging and discharging time setting unit 313A may supply the first capacitor control unit 314 with the charging instruction signal INPLS which continues over the charging time, in the same manner as the charging and discharging time setting unit 313 in the above-described embodiment. In addition, the charging and discharging time setting unit 313A may supply the first capacitor control unit 314 with the reset instruction signal RST for causing the first capacitor 311 to be reset before the charging instruction signal INPLS is supplied.

(2.1.2-2. Second Capacitor Control Unit 323A)

The second capacitor control unit 323A controls charging and discharging of the second capacitor 321 in the same manner as the second capacitor control unit 323 in the above-described embodiment. In response to the rise of the asynchronous input signal IN, the second capacitor control unit 323A may charge the second capacitor 321 over the set time $Tset_r$, and then discharge the second capacitor 321 over at least the set time $Tset_r$ from the synchronous delay timing $t5_r$. In response to the fall of the asynchronous input signal IN, the second capacitor control unit 323A may charge the second capacitor 321 over the set time $Tset_f$, and then discharge the second capacitor 321 over at least the set time $Tset_f$ from the synchronous delay timing $t5_f$. The second capacitor control unit 323A may cause the second capacitor 321 to be charged in response to the charging instruction signal RCC supplied from the charging time setting unit 23A. The second capacitor control unit 323A may cause the second capacitor 321 to be discharged in response to the discharging instruction signal RCD supplied from the discharging time setting unit 24A.

(2.1.2-3. Current Switching Unit 328A)

The current switching unit 328A makes a current value of the constant current $I_2$ caused to flow by the second capacitor control unit 323A during a longer set time Tset of the set time $Tset_r$ and the set time $Tset_f$ smaller than a current value of the constant current $I_2$ caused to flow by the second capacitor control unit 323A during a shorter set time Tset. As an example in this modified example, since a cycle of the clock signal $CLK_r$ is longer than a cycle of the clock signal $CLK_f$, the set time $Tset_r$ is longer than the set time $Tset_f$ even if the set time $Tset_r$ and the set time $Tset_f$ have a length equivalent to the same cycle. As such, the current switching unit 328A may make the current value of the constant current $I_2$ during the set time $Tset_r$ smaller than the current value of the constant current $I_2$ during the set time $Tset_f$.

The current switching unit 328A may make the current value of the constant current $I_2$ small enough to avoid the second capacitor 321 being fully charged through charging performed over the set time $Tset_r$. The current switching unit 328A may also reduce a current value of the constant current $I_1$ for charging the first capacitor 311 in response to the rise of the asynchronous input signal IN, such that a relationship between the constant currents $I_1$, $I_2$ and the capacitances $C_1$, $C_2$ satisfies $I_2 = I_1 \times C_2/C_1$ for each of the rise and fall of the asynchronous input signal IN.

The current switching unit 328A may receive the asynchronous input signal IN, and may reduce the current values of the constant currents $I_1$, $I_2$ in response to the rise of the asynchronous input signal IN and restore the current values of the constant currents $I_1$, $I_2$ to their original magnitudes in response to the fall of the asynchronous input signal IN. The current switching unit 328A may switch the current value to a large or small value by various kinds of hitherto known methods. For example, the current sources 312, 322 may cause the constant currents $I_1$, $I_2$ to flow between themselves and the first capacitor 311, the second capacitor 321 by using a current mirror circuit, and the current switching unit 328A may switch the current values of the constant currents $I_1$, $I_2$ by switching a current mirror ratio of that current mirror circuit according to a signal level of the asynchronous input signal IN.

As an example, each of the current sources 312, 322 may include two transistors connected in parallel in a mirror source of the current mirror circuit. The current switching unit 328A may, for each of the current sources 312, 322, cause a reference current to be shunt to these two transistors in response to the rise of the asynchronous input signal IN, and switch the current mirror ratio by causing the reference current to flow through only one transistor in response to the fall of the asynchronous input signal IN. Alternatively, the current switching unit 328A may change a magnitude of the reference current supplied to each of the current sources 312, 322 according to the signal level of the asynchronous input signal IN.

According to the delay apparatus 1A described above, in response to the rise of the asynchronous input signal IN, the synchronous delay timing $t5_r$ later than that detection timing $t2_r$ by the reference delay time $TS_r$ is detected, and in response to the fall of the asynchronous input signal IN, the synchronous delay timing $t5_f$ later than that detection timing $t2_f$ by the reference delay time $TS_f$ is detected. Therefore, differentiating the reference delay time $TS_r$ and the reference delay time $TS_f$ can differentiate the delay time $Td_r$ from the rise of the asynchronous input signal IN to a rise of the delayed signal OUT and the delay time $Td_f$ from the fall of the asynchronous input signal IN to a fall of the delayed signal OUT.

In addition, the number of changes in the clock signal $CLK_r$ is detected from the detection timing $t2_r$ at which the rise of the asynchronous input signal IN has been detected in synchronization with the clock signal $CLK_r$, and the synchronous delay timing $t5_r$ is detected based on the timing at which the count value CNT has reached the reference count value. In addition, the number of changes in the clock signal $CLK_f$ is detected from the detection timing $t2_f$ at which the fall of the asynchronous input signal IN has been detected in synchronization with the clock signal $CLK_f$, and the synchronous delay timing $t5_f$ is detected based on the timing at which the count value CNT has reached the reference count value. Therefore, use of the two clock signals $CLK_r$, $CLK_f$ and a common reference counter value can differentiate the reference delay time $TS_r$ from the detection timing $t2_r$ to the synchronous delay timing $t5_r$ and the reference delay time $TS_f$ from the detection timing $t2_f$ to the synchronous delay timing $t5_f$. Accordingly, it is possible to differentiate the delay time $Td_r$ from the rise of the asynchronous input signal IN to the rise of the delayed signal OUT and the delay time $Td_f$ from the fall of the asynchronous input signal IN to the fall of the delayed signal OUT.

In addition, the current value of the constant current $I_2$ caused to flow by the second capacitor control unit 323A during the longer set time Tset of the set time $Tset_r$ in response to the rise of the asynchronous input signal IN and the set time $Tset_f$ in response to the fall of the asynchronous input signal IN is made smaller than the current value of the constant current $I_2$ caused to flow by the second capacitor control unit 323A during the shorter set time Tset. Therefore, it is possible to prevent a long set time Tset from causing an amount of charge charged during that set time Tset to exceed a capacity of the second capacitor 321, to decrease detection accuracy of the asynchronous delay timing t6.

(2.2. Operation Waveform)

Figure 5:
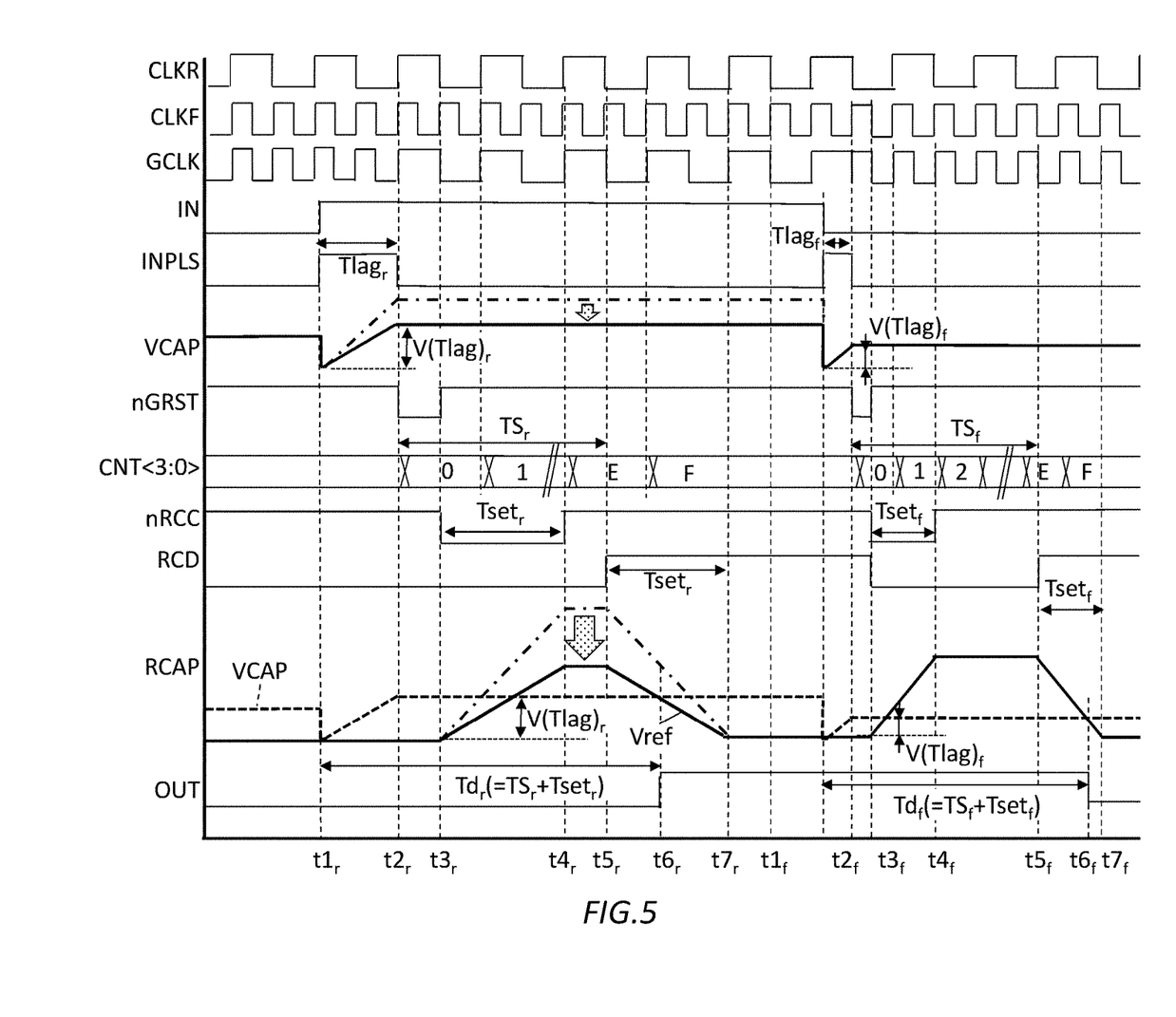
FIG. 5 shows operation waveforms of the delay apparatus 1A.

FIG. 5 shows operation waveforms of the delay apparatus 1A together with the counter value CNT. Note that, in this operation example, description will be made assuming that the set time $Tset_r$ is longer than the set time $Tset_f$.

When the asynchronous input signal IN rises at a timing asynchronous with the clock signal CLK at a time point $t1_r$, the charging and discharging time setting unit 313A outputs the reset signal RST (not shown) to the first capacitor control unit 314 to reset the first capacitor 311, and then the charging instruction signal INPLS is switched to a high level to start charging of the first capacitor 311. Here, in this operation example, since the set time $Tset_r$ is longer than the set time $Tset_f$, a current value of the constant current $I_1$ for charging the first capacitor 311 is reduced by the current switching unit 328A in response to the rise of the asynchronous input signal IN. Note that, in the figure, a thick solid line indicates the charging voltage VCAP of the first capacitor 311 for when the current value of the constant current $I_1$ is reduced, and a dashed-dotted line indicates the charging voltage VCAP of the first capacitor 311 for when the current value of the constant current $I_1$ is not reduced.

At the time point $t2_r$, the synchronous detection unit $21_r$ detects a change in the asynchronous input signal IN at a rise timing of the clock signal CLK. Accordingly, a signal level of the signal S $(t2)_r$ (not shown) from the synchronous detection unit $21_r$ is switched, the charging and discharging time setting unit 313A switches the charging instruction signal INPLS to a low level, and the charging of the first capacitor 311 ends. As a result, the first capacitor 311 is charged over the detection delay time $Tlag_r$ from the change timing $t1_r$ to the detection timing $t2_r$, and the charging voltage VCAP becomes a delay time corresponding value V $(Tlag)_r$.

In addition, the synchronous detection unit $21_r$ outputs the reset signal GRST having a pulse width equivalent to a half cycle of the clock signal $CLK_r$ from the detection timing $t2_r$, to cause a count value by the counter 22A to be reset. Accordingly, the counter 22A selects the clock signal $CLK_r$ as the clock signal GCLK.

When the reset signal GRST ends at the time point $t3_r$, the counter 22A starts counting up by using the clock signal GCLK (the clock signal $CLK_r$ here). Accordingly, the charging time setting unit 23A outputs the charging instruction signal RCC which continues over the set time $Tset_r$ from the time point $t3_r$ to the time point $t4_r$, and causes the second capacitor 321 to be charged. Here, in the this operation example, since the set time $Tset_r$ is longer than the set time $Tset_f$, a current value of the constant current $I_2$ during the set time $Tset_r$ is made smaller than a current value of the constant current $I_2$ during the set time $Tset_f$ by the current switching unit 328A. The same applies to the set time $Tset_r$ from the time point $t5_r$ to the time point $t7_r$ to be described below.

Note that, in the figure, a thick solid line indicates the charging voltage RCAP of the second capacitor 321 for when the current value of the constant current $I_2$ is reduced, and a dashed-dotted line indicates the charging voltage RCAP of the second capacitor 321 for when the current value of the constant current $I_2$ is not reduced. As indicated by these lines, in this operation example, as a result of the current value of the constant current $I_2$ being reduced during the set time $Tset_r$, an amount of charge charged during that set time $Tset_r$ is prevented from exceeding a capacity of the second capacitor 321.

When a time elapsed since the detection timing $t2_r$ reaches the reference delay time $TS_r$ at a time point $t5_r$, the discharging time setting unit 24A outputs the discharging instruction signal RCD which continues over at least the set time $Tset_r$ from the time point $t5_r$ to the time point $t7_r$. Accordingly, the remaining amount of charge Vref of the second capacitor 321 decreases at a constant speed from the time point $t5_r$ to the time point $t7_r$.

When the remaining amount of charge Vref decreases to the delay time corresponding value V $(Tlag)_r$ at the time point $t6_r$, the delayed signal OUT rises. Accordingly, the delayed signal OUT rises at a timing delayed from the rise of the asynchronous input signal IN by the desired delay time $Td_r$ ($=TS_r+Tset_r$).

When the asynchronous input signal IN falls at a timing asynchronous with the clock signal CLK at a time point $t1_f$, the charging and discharging time setting unit 313A outputs the reset signal RST (not shown) to the first capacitor control unit 314 to reset the first capacitor 311, and then the charging instruction signal INPLS is switched to a high level to start the charging of the first capacitor 311. Here, in this operation example, since the set time $Tset_r$ is longer than the set time $Tset_f$, the current value of the constant current $I_1$ for charging the first capacitor 311 is restored to its original magnitude by the current switching unit 328A.

At the time point $t2_f$, the synchronous detection unit $21_f$ detects the change in the asynchronous input signal IN at a rise timing of the clock signal $CLK_f$. Accordingly, a signal level of the signal S $(t2)_f$ (not shown) from the synchronous detection unit $21_f$ is switched, the charging and discharging time setting unit 313A switches the charging instruction signal INPLS to a low level, and the charging of the first capacitor 311 ends. As a result, the first capacitor 311 is charged over the detection delay time $Tlag_f$ from the change timing $t1_f$ to the detection timing $t2_f$, and the charging voltage VCAP becomes the delay time corresponding value V $(Tlag)_f$.

In addition, the synchronous detection unit $21_f$ outputs the reset signal GRST having a pulse width equivalent to a half cycle of the clock signal $CLK_f$ from the detection timing $t2_f$ to cause the count value by the counter 22A to be reset. Accordingly, the counter 22A selects the clock signal $CLK_f$ as the clock signal GCLK.

When the reset signal GRST ends at the time point $t3_f$, the counter 22A starts counting up by using the clock signal GCLK (the clock signal $CLK_f$ here). Accordingly, the charging time setting unit 23A outputs the charging instruction signal RCC which continues over the set time $Tset_f$ from the time point $t3_f$ to the time point $t4_f$, and causes the second capacitor 321 to be charged. Here, in this operation example, since the set time $Tset_r$ is longer than the set time $Tset_f$, the current value of the constant current $I_2$ during the set time $Tset_f$ is restored to its original magnitude by the current switching unit 328A. The same applies to the set time $Tset_f$ from the time point $t5_f$ to the time point $t7_f$ to be described below.

When a time elapsed since the detection timing $t2_f$ reaches the reference delay time TS at the time point $t5_f$, the discharging time setting unit 24A outputs the discharging instruction signal RCD which continues over at least the set time $Tset_f$ from the time point $t5_f$ to the time point $t7_f$. Accordingly, the remaining amount of charge Vref of the second capacitor 321 decreases at a constant speed from the time point $t5_f$ to the time point $t7_f$.

When the remaining amount of charge Vref decreases to the delay time corresponding value V (Tlag)$_f$ at the time point t6$_f$, the delayed signal OUT falls. Accordingly, the delayed signal OUT falls at a timing delayed from the fall of the asynchronous input signal IN by the desired delay time Td$_f$(=TS$_f$+Tset$_f$).

3. Other Modified Examples

Note that, in the above-described embodiment and modified example, the description has been made assuming that only one set of the first capacitor 311 and the second capacitor 321 is provided, but two sets may be provided. In this case, different sets of the first capacitor 311 and the second capacitor 321 may be used for when delaying a rise of the asynchronous input signal IN and for when delaying a fall of the asynchronous input signal IN.

In addition, the description has been made assuming that a pulse length of the asynchronous input signal IN is longer than the delay time Td, but it may be shorter than the delay time Td. In this case, different sets of the first capacitor 311 and the second capacitor 321 may be provided for when delaying the rise of the asynchronous input signal IN and for when delaying the fall of the asynchronous input signal IN. Alternatively, if the pulse length of the asynchronous input signal IN is shorter than the delay time Td, that is, if a time from the change timing t1$_r$ of the rise to the change timing t1$_f$ of the fall of the asynchronous input signal IN is shorter than the delay time Td, operation resulting from the change in the rise and fall described above may be disabled. In this case, noise having a pulse length shorter the delay time Td is prevented from being output as the delayed signal OUT.

In addition, in the above-described embodiment, the description has been made assuming that the clock signal CLK is supplied from the oscillator to each unit of the synchronous delay unit 2 via the synchronous detection unit 21, but it may be supplied directly from the oscillator to each unit of the synchronous delay unit 2.

In addition, in the above-described modified example, the description has been made assuming that the discharging time setting unit 24A detects the synchronous delay timing t5r based on the timing at which the count value of the number of changes in the clock signal CLK$_r$ has reached the reference count value and detects the synchronous delay timing t5$_f$ based on the timing at which the count value of the number of changes in the clock signal CLK$_f$ has reached the reference count value, but the synchronous delay timings t5$_r$, t5$_f$ may be detected by another approach. For example, the discharging time setting unit 24A may detect the synchronous delay timing t5r based on a timing at which the count value by the counter 22A from the detection timing t2$_r$ at which the rise of the asynchronous input signal IN has been detected has reached a first reference count value, and detect the synchronous delay timing t5$_f$ based on a timing at which the count value by the counter 22 from the detection timing t2$_f$ at which the fall of the asynchronous input signal IN has been detected has reached a second reference count value. The clock signal CLK input to the counter 22A may be common. In this case again, setting the first reference count value and the second reference count value to different values can differentiate the reference delay time TS$_r$ from the detection timing t2$_r$ to the synchronous delay timing t5$_r$ and the reference delay time TS$_f$ from the detection timing t2$_f$ to the synchronous delay timing t5$_f$. Therefore, it is possible to differentiate the delay time Td$_r$ from the rise of the asynchronous input signal IN to the rise of the delayed signal OUT and the delay time Td$_f$ from the fall of the asynchronous input signal IN to the fall of the delayed signal OUT.

While the present invention has been described by way of the embodiments, the technical scope of the present invention is not limited to the scope described in the above-described embodiments. It is apparent to persons skilled in the art that various alterations or improvements can be made to the above-described embodiments. It is apparent from the description of the claims that embodiments added with such alterations or improvements can also be included in the technical scope of the present invention.

It should be noted that the operations, procedures, steps, stages, and the like of each process performed by an apparatus, system, program, and method shown in the claims, embodiments, or diagrams can be performed in any order as long as the order is not indicated by "prior to," "before," or the like and as long as the output from a previous process is not used in a later process. Even if the operation flow is described using phrases such as "first" or "next" in the claims, embodiments, or diagrams for convenience, it does not necessarily mean that the process must be performed in this order.

EXPLANATION OF REFERENCES

1: delay apparatus
2: synchronous delay unit
3: asynchronous delay unit
10: reception unit
21: synchronous detection unit
22: counter
23: charging time setting unit
24: discharging time setting unit (reference delay time elapse detection unit)
31: delay time acquisition unit
32: adjustment time elapse detection unit
311: first capacitor
312: current source
313: charging and discharging time setting unit
314: first capacitor control unit
315: corresponding value detection unit
321: second capacitor
322: current source
323: second capacitor control unit
324: corresponding value detection unit
325: timing detection unit
326: output unit
328: current switching unit.

What is claimed is:

1. A delay apparatus which outputs a delayed signal obtained by delaying an asynchronous input signal, the delay apparatus comprising:
   a synchronous delay unit which determines, in response to detection of a change in the asynchronous input signal at a detection timing synchronous with a clock signal, a synchronous delay timing later than the detection timing by a reference delay time according to the clock signal; and
   an asynchronous delay unit which changes the delayed signal at an asynchronous delay timing obtained by delaying the synchronous delay timing by an adjustment time obtained by subtracting a detection delay time from a change timing of the asynchronous input signal to the detection timing from a set time according to the clock signal.

2. The delay apparatus according to claim 1, wherein the asynchronous delay unit includes:
a delay time acquisition unit which acquires a delay time corresponding value according to the detection delay time; and
an adjustment time elapse detection unit which detects the asynchronous delay timing later than the synchronous delay timing by the adjustment time based on the delay time corresponding value.

3. The delay apparatus according to claim 2, wherein the delay time acquisition unit includes:
a first capacitor charged with a constant current;
a first capacitor control unit which controls charging of the first capacitor; and
a corresponding value detection unit which detects, as the delay time corresponding value, a value according to an amount of charge charged to the first capacitor over the detection delay time.

4. The delay apparatus according to claim 3, wherein the adjustment time elapse detection unit includes:
a second capacitor discharged with a constant current;
a second capacitor control unit which causes the second capacitor to be charged to an amount of charge corresponding to the set time, and then causes discharging of the second capacitor to be started from the synchronous delay timing; and
a timing detection unit which detects, as the asynchronous delay timing, a timing at which a value according to a remaining amount of charge of the second capacitor has decreased to the delay time corresponding value.

5. The delay apparatus according to claim 4, wherein the second capacitor is charged and discharged with a constant current having a same current value by the second capacitor control unit, and
the second capacitor control unit charges the second capacitor over the set time, and then discharges the second capacitor over at least the set time from the synchronous delay timing.

6. The delay apparatus according to claim 5, wherein the second capacitor control unit
in response to a rise of the asynchronous input signal, charges the second capacitor over a first set time of set times including the set time, and then discharges the second capacitor over at least the first set time from the synchronous delay timing, and
in response to a fall of the asynchronous input signal, charges the second capacitor over a second set time of set times including the set time, and then discharges the second capacitor over at least the second set time from the synchronous delay timing, and
the adjustment time elapse detection unit includes
a current switching unit which makes a current value of a constant current caused to flow by the second capacitor control unit during a longer set time of the first set time and the second set time smaller than a current value of a constant current caused to flow by the second capacitor control unit during a shorter set time.

7. The delay apparatus according to claim 1, wherein the synchronous delay unit includes:
a synchronous detection unit which detects the change in the asynchronous input signal at a timing synchronous with the clock signal;
a counter which counts a number of at least one change in the clock signal; and
a reference delay time elapse detection unit which detects, as the synchronous delay timing, a timing at which the reference delay time has elapsed since the detection timing based on a count value by the counter.

8. The delay apparatus according to claim 7, wherein the reference delay time elapse detection unit
in response to a rise of the asynchronous input signal, detects a first synchronous delay timing of synchronous delay timings including the synchronous delay timing later than the detection timing at which the rise of the asynchronous input signal has been detected by a first reference delay time of reference delay times including the reference delay time, and
in response to a fall of the asynchronous input signal, detects a second synchronous delay timing of synchronous delay timings including the synchronous delay timing later than the detection timing at which the fall of the asynchronous input signal has been detected by a second reference delay time of reference delay times including the reference delay time.

9. The delay apparatus according to claim 8, wherein the reference delay time elapse detection unit
detects the first synchronous delay timing based on a timing at which the count value by the counter from the detection timing at which the rise of the asynchronous input signal has been detected has reached a first reference count value, and
detects the second synchronous delay timing based on a timing at which the count value by the counter from the detection timing at which the fall of the asynchronous input signal has been detected has reached a second reference count value.

10. The delay apparatus according to claim 8, wherein the synchronous detection unit includes:
a first synchronous detection unit which detects the rise of the asynchronous input signal at a timing synchronous with a first clock signal; and
a second synchronous detection unit which detects the fall of the asynchronous input signal at a timing synchronous with a second clock signal,
the counter
detects a number of at least one change in the first clock signal from a first detection timing of detection timings including the detection timing at which the rise of the asynchronous input signal has been detected by the first synchronous detection unit, and
detects a number of at least one change in the second clock signal from a second detection timing of detection timings including the detection timing at which the fall of the asynchronous input signal has been detected by the second synchronous detection unit, and
the reference delay time elapse detection unit
detects the first synchronous delay timing based on a timing at which the count value by the counter from the first detection timing has reached a reference count value, and
detects the second synchronous delay timing based on a timing at which the count value by the counter from the second detection timing has reached the reference count value.

11. A delay method for outputting a delayed signal obtained by delaying an asynchronous input signal, the delay method comprising:
determining, in response to detection of a change in the asynchronous input signal at a detection timing synchronous with a clock signal, a synchronous delay timing later than the detection timing by a reference delay time according to the clock signal; and changing the delayed signal at an asynchronous delay timing obtained by delaying the synchronous delay timing by an adjustment time obtained by subtracting a detection delay time from a change timing of the asynchronous input signal to the detection timing from a set time according to the clock signal.

* * * * *